(12) United States Patent
Komatsu

(10) Patent No.: US 6,960,420 B2
(45) Date of Patent: Nov. 1, 2005

(54) PHOTOSENSITIVE RESIN COMPOSITION, PROCESS FOR FORMING RELIEF PATTERN, AND ELECTRONIC COMPONENT

(75) Inventor: Hiroshi Komatsu, Ibaraki (JP)

(73) Assignees: Hitachi Chemical Dupont Microsystems LTD, Tokyo (JP); Hitachi Chemical Dupont Microsystem L.L.C., Wilmington, DE (US)

(*) Notice: Subject to any disclaimer, the term of this patent is extended or adjusted under 35 U.S.C. 154(b) by 0 days.

(21) Appl. No.: 10/701,448

(22) Filed: Nov. 6, 2003

(65) Prior Publication Data

US 2004/0142275 A1 Jul. 22, 2004

(30) Foreign Application Priority Data

Nov. 6, 2002 (JP) ........................................ 2002-322700
Jan. 21, 2003 (JP) ........................................ 2003-011888

(51) Int. Cl.$^7$ ............................................... G03F 7/004
(52) U.S. Cl. ............................. 430/270.1; 430/283.1; 430/330
(58) Field of Search .................... 430/270.1, 283.1, 430/330

(56) References Cited

U.S. PATENT DOCUMENTS 4,339,521 A 7/1982 Ahne et al. ................. 430/192

FOREIGN PATENT DOCUMENTS

| JP | 54109828 | 8/1979 |
| JP | 146862 | 10/1989 |
| JP | 11109620 | 4/1999 |
| JP | 11143070 | 5/1999 |

OTHER PUBLICATIONS

Machine English language translation of JP 2002012665 A2 20020115 with respect to Claims and Detailed Description.*
Computer generating chemical structure search of JP 2002012665, Nov. 17, 2004.*

* cited by examiner

Primary Examiner—Hoa Van Le
(74) Attorney, Agent, or Firm—Antonelli, Terry, Stout and Kraus, LLP.

(57) ABSTRACT

A photosensitive resin composition is disclosed that includes (A) a heat-resistant polymer of the general formula (1):

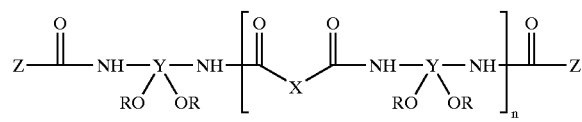

(where the symbols are as defined in the specification), (B) a photoreactive compound, and (C) a solvent. A relief pattern is formed from the composition by applying the composition to a support substrate and drying it to form a photosensitive resin film; exposing the dried film; developing the exposed film using an alkaline aqueous solution; and heating the developed photosensitive resin film. Also disclosed is an electronic component that includes an electronic device having such a pattern.

16 Claims, 1 Drawing Sheet

PHOTOSENSITIVE RESIN COMPOSITION, PROCESS FOR FORMING RELIEF PATTERN, AND ELECTRONIC COMPONENT

BACKGROUND OF THE INVENTION

1) Field of the Invention

The present invention relates to a photosensitive resin composition having heat resistance, and more particularly to a photosensitive resin composition which can be applied to semiconductor devices and the like as a surface protecting film layer or an interlayer dielectric film layer. The present invention also relates to a process for forming a relief pattern using the composition, and to an electronic component having such a pattern.

2) Description of the Related Art

In the semiconductor industry, inorganic materials have been conventionally used as materials for interlayer dielectric film layers. However, in recent years, organic substances having excellent heat resistance, such as polyimide resins, have come to be used increasingly as the materials for interlayer dielectric film layers, taking the advantage of their properties.

On the other hand, formation of circuit patterns on semiconductor integrated circuits and printed boards is achieved through a cumbersome, wide-ranging process including formation of a resist layer on the surface of a substrate, exposure of predetermined portions thereof, removal of unnecessary portions by, for example, etching, and a cleaning operation for the surface of the substrate. Therefore, if the resist which lies on portions where an insulating material needs to be provided after the formation of patterns by exposure and development can remain as it is and used as an insulating material, the semiconductor fabrication process will be considerably shortened.

Recently, for shortening the semiconductor fabrication process, as resins used as the resist, use of photosensitive polyimides and polybenzoxazoles as constituent resins for use in resists is becoming mainstream since these resins per se can be imparted with photosensitivity and enable easy pattern formation merely by application, exposure, and development.

The conventional photosensitive polyimides are mainly of the negative type in which an organic solvent is used as a developer and the exposed portion is insolubilized. For example, a polyimide produced by a method in which a compound having a photosensitive group is added to an acid functional group of a polyimide precursor or mixed with the polyimide precursor having an acid functional group is used as a negative photosensitive polyimide which creates a contrast by a photocrosslinking reaction. A related technology has been disclosed in Japanese Patent Application Laid-open No. S54-109828.

On the other hand, recently, there has been an increasing demand of development with an alkaline aqueous solution in order to reduce the cost for materials and protect the environment. Conventionally, those photosensitive resins including a naphthoquinonediazide compound as a photosensitive agent and a polybenzoxazole precursor having an acid functional group as a base resin have been proposed as described in Japanese Patent Application No. H1-46862.

In the case of a positive photosensitive polyimide, the polymer has a low molecular weight and further, unlike the negative polyimide, it does not increase in molecular weight by, for example, crosslinking during the processing, so that the relief pattern obtained after the exposure and development may be fused by heating during the curing process. To overcome such a problem, introduction of a crosslinkable group having a C=C double bond into the terminals of the polymer has been proposed as described in Japanese Patent Application Laid-open No. H11-109620 and Japanese Patent application Laid-open No. H11-143070, respectively.

The photosensitive resins including a naphthoquinonediazide compound as a photosensitive agent and a polybenzoxazole precursor having an acid functional group as a base resin are designed laying importance on the development properties, and hence the molecular weight of the polymer is set to a lower level to thereby increase the solubility. However, the polymer having a decreased molecular weight cannot exhibit satisfactory mechanical properties even when it is cured, and thus the conventional photosensitive resin materials lack favorable properties as the resin.

Further, in the above positive photosensitive resin materials, the C=C double bond possibly undergoes polymerization through a dark reaction. For this reason, the resin changes in viscosity with time, thereby lowering the storage stability. Specifically, a problem arises in that it is difficult to maintain initial properties, such as resin properties and application properties, and photosensitivity properties.

SUMMARY OF THE INVENTION

As a result of extensive studies by the inventors of the present invention, it has now been found that, when a photosensitive resin composition contains a base polymer whose terminal groups have introduced therein a compound group having a cyclic structure which is free of reactive unsaturated bonds, the photosensitive resin composition not only can form a cured resin having desired properties without impairing the development properties, but also can have an enhanced storage stability.

Therefore, it is an object of the present invention to provide a heat-resistant resin composition which forms a cured resin having excellent properties and which has enhanced storage stability since the resin composition contains a base polymer whose terminal groups have each incorporated therein a compound group having a cyclic structure which is free of reactive unsaturated bonds.

Another object of the present invention is to provide a process for forming a relief pattern using such a resin composition.

Still another object of the present invention is to provide an electronic component having an electronic device with such a pattern.

In one aspect, the present invention provides a photosensitive resin composition including: (A) a heat-resistant polymer represented by general formula (1):

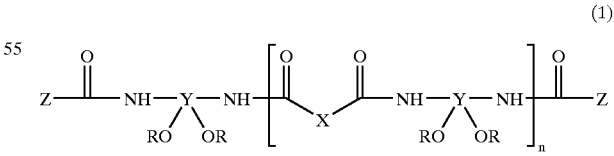

where X represents a divalent organic group; Y represents a tetravalent organic group; Z represents a cyclic compound group free of reactive unsaturated bonds; R represents hydrogen or a monovalent organic group; and n is an integer of 2 to 500 and represents the number of repeating units of the polymer; (B) a photoreactive compound; and (C) a solvent.

In another aspect, the present invention provides a process for forming a relief pattern, including: applying the photosensitive resin composition according to claim 1 to a support substrate and drying the composition applied to form a photosensitive resin film; subjecting the dried photosensitive resin film to exposure; subjecting the exposed photosensitive resin film to development using an alkaline aqueous solution; and subjecting the developed photosensitive resin film to heating treatment.

In still another aspect, the present invention provides an electronic component having an electronic device including at least an interlayer dielectric film layer and a surface protecting film layer, wherein at least one of the interlayer dielectric film layer and the surface protecting film layer comprises a resin film formed from the aforementioned photosensitive resin composition.

The present invention provides a heat-resistant photosensitive resin composition having improved storage stability while maintaining development properties equivalent to those of conventional photosensitive resin compositions.

The other objects, features and advantages of the present invention are specifically set forth in or will become apparent from the following detailed descriptions of the invention when read in conjunction with the accompanying drawings.

DETAILED DESCRIPTIONS

Figure 1A:
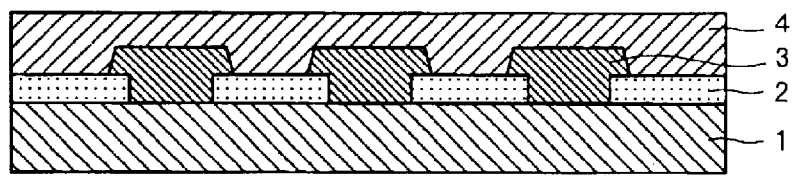
FIGS. 1A to 1E are cross-sectional views that illustrate a process of fabricating a semiconductor device having a multilayer wiring configuration according to the present invention.

The photosensitive resin composition of the present invention includes (A) a heat-resistant polymer represented by the general formula (1), (B) a photoreactive compound, and (C) a solvent as essential components.

The heat-resistant polymer (A) used in the present invention is a polybenzoxazole precursor represented by the general formula (1), which is obtained from, for example, a dicarboxylic acid and a dihydroxydiamine, such as a bisaminophenol.

In the general formula (1), X represents a divalent organic group, and more particularly an aliphatic group having a linear chain, a branched chain, or a cyclic structure, or an aromatic group and may have a substituent on its main chain or ring. Examples of the aliphatic group include alkyl chains, and cycloalkyl rings such as a cyclopentyl ring, a cyclohexyl ring, a cyclooctyl ring, and bicyclo rings. These substituents may contain in their skeleton a heteroatom, such as oxygen, sulfur, nitrogen, or silicon, or an organic group, such as a ketone, an ester, or an amide. Examples of the aromatic group include substituents, such as a benzene ring and a naphthalene ring. These substituents may have a substituent on their main chain or ring, and may contain a heteroatom, such as oxygen, sulfur, nitrogen, or silicon, and may be bonded through a heteroatom, such as oxygen, sulfur, nitrogen, or silicon, or an organic group, such as a ketone, an ester, or an amide.

For the synthesis of the heat-resistant polymer of the general formula (1), a method using, for example, a dicarboxylic acid having the organic group X is generally known. Out of the dicarboxylic acid compounds having the organic group X, those which are known aliphatic dicarboxylic acid compounds include, for example, malonic acid, methylmalonic acid, dimethylmalonic acid, butylmalonic acid, succinic acid, glutaric acid, 2,2-dimethylglutaric acid, adipic acid, itaconic acid, maleic acid, tetrafluoromaleic acid, diglycolic acid, 1,1-cyclobutanedicarboxylic acid, 1,2-cyclopentanedicarboxylic acid, 3,3-tetramethyleneglutaric acid, camphoric acid, 1,2-cyclohexanedicarboxylic acid, 1,3-cyclohexanedicarboxylic acid, 1,4-cyclohexanedicarboxylic acid, 1,3-adamantanedicarboxylic acid, 5-norbornane-2,3-dicarboxylic acid, phenylmalonic acid, benzylmalonic acid, 1,2-phenylenedioxydiacetic acid, 1,3-phenylenediacetic acid, 1,4-phenylenediacetic acid, and 2,2-iminodibenzoic acid.

The dicarboxylic acid compounds having the organic group X are preferably aromatic dicarboxylic acid compounds in view of heat resistance. Examples of known aromatic dicarboxylic acid compounds include 3-fluoroisophthalic acid, 2-fluoroisophthalic acid, 3-fluorophthalic acid, 2-fluorophthalic acid, 2,4,5,6-tetrafluoroisophthalic acid, 3,4,5,6-tetrafluorophthalic acid, 4,4'-hexafluoroisopropylidenediphenyldicarboxylic acid, perfluorosuberic acid, 2,2'-bis(trifluoromethyl)-4,4'-biphenylenedicarboxylic acid, terephthalic acid, isophthalic acid, 4,4'-oxydiphenyldicarboxylic acid, 5-nitroisophthalic acid, 1,4-naphthalenedicarboxylic acid, 2,6-naphthalenedicarboxylic acid, and 4,4'-biphenyldicarboxylic acid. These known dicarboxylic acids may be used individually or as combinations of two or more of them. The dicarboxylic acids are not limited to these.

Y in the general formula (1) is a tetravalent organic group, and is an aliphatic group having a linear chain, a branched chain, or a cyclic structure, or an aromatic group, and may have a substituent on its main chain or ring. Examples of the aliphatic group include alkyl chains, cycloalkyl rings such as a cyclopentyl ring, a cyclohexyl ring, and a cyclooctyl ring, and bicyclo rings. These substituents may contain in their skeleton a heteroatom, such as oxygen, sulfur, nitrogen, or silicon, or an organic group, such as a ketone, an ester, or an amide. Examples of the aromatic group include substituents, such as a benzene ring and a naphthalene ring. These substituents may have a substituent on their main chain or ring, and may contain a heteroatom, such as oxygen, sulfur, nitrogen, or silicon, and may be bonded through a heteroatom, such as oxygen, sulfur, nitrogen, or silicon, or an organic group, such as a ketone, an ester, or an amide.

The compounds having the organic group Y are preferably aromatic compounds in view of developer properties and heat resistance, and, in the synthesis of the heat-resistant polymer of general formula (1), a method using, for example, a bisaminophenol having the organic group Y is generally used. Examples of known bisaminophenol compounds used as the organic group Y include 4,4'-diamino-3,3'-dihydroxybiphenyl, 2,2'-bis(3-amino-4-hydroxyphenyl)propane, and 2,2'-bis(3-amino-4-hydroxyphenyl)hexafluoropropane. These bisaminophenols may be used individually or as combinations of two or more of them. The bisaminophenols are not limited to these.

Z in the general formula (1) described above is a cyclic compound group which is free of reactive unsaturated bonds. Examples of the cyclic compound group include cyclopropyl, cyclobutyl, cyclopentyl, cyclohexyl, cyclohexylmethyl, cyclohexenyl, norbornyl, norbornenyl, adamantyl, 2-methylcyclopropenyl, 1-hydroxy-1-cyclopropyl, 1-carboxy-1-cyclopropyl, 1-carboxy-1-cyclobutyl, phenyl, 2-phenyl-1-cyclopropyl, 1-phenyl-1-cyclopropyl, 1-phenyl-1-cyclopentyl, and 1-benzocyclobutenyl.

Among the cyclic compound groups which are free of reactive unsaturated bonds, the organic group Z is preferably an alicyclic compound group, and more preferably a cyclic compound group having an alicyclic structure having 3 or 4 carbon atoms since a cured resin having more excellent properties is obtained. Examples of such include cyclopropyl, cyclobutyl, 2-phenyl-1-cyclopropyl, 1-phenyl-1-cyclopropyl, 1-benzocyclobutenyl, 2-methylcyclopropenyl, 1-hydroxy-1-cyclopropyl, 1-carboxy-1-cyclopropyl, and 1-carboxy-1-cyclobutyl.

Introduction of functional groups into R in the general formula (1) described above enables control of the solubility in a developer and/or pattern processing utilizing a photoreaction. Further, introduction of functional groups partially enables control of the degree of solubility in alkali.

The functional group R can be introduced through an ether linkage or an ester linkage. The functional group R may contain in their skeleton a heteroatom, such as oxygen, sulfur, nitrogen, or silicon, or an organic group, such as a ketone, an ester, or an amide.

Preferred examples of the functional group R from the viewpoint of advantageously controlling the solubility of the polymer (A) include those in which the functional group introduced into the functional group R has 1 to 15 carbon atoms, and specific examples thereof include methyl, ethyl, propyl, isopropyl, n-butyl, sec-butyl, tert-butyl, cyclopropyl, cyclobutyl, cyclopentyl, cyclohexyl, cyclohexylmethyl, cyclohexenyl, norbornyl, norbornenyl, adamantyl, benzyl, p-nitrobenzyl, trifluoromethyl, methoxyethyl, ethoxyethyl, methoxymethyl, ethoxymethyl, methoxyethoxymethyl, tetrahydropyranyl, ethoxytetrahydropyranyl, tetrahydrofuranyl, 2-trimethylsilylethoxymethyl, trimethylsilyl, tert-butyldimethylsilyl, 3-oxocyclohexyl, 9-fluorenylmethyl, and methylthiomethyl. The functional groups are not limited to these.

It is preferred that the heat-resistant polymer of the general formula (1) has a weight average molecular weight in the range of 5,000 to 80,000. The weight average molecular weight is obtained by measuring molecular weights by a gel permeation chromatography method, converting the obtained values into standard polystyrene values using a calibration curve obtained from standard polystyrene, and calculating a weighted arithmetic average based on weight.

The heat-resistant polymer (A) of the general formula (1) can be synthesized by, for example, reacting an active ester compound derived from a dicarboxylic acid having an X portion with a diamino compound having a Y portion in an organic solvent. Examples of such a synthesis method include synthesis methods utilizing deacidhalogenation between an acid halide compound and a diamino compound.

In the synthesis of heat-resistant polymer (A), it is desirable that the equivalent ratio of a dicarboxylic acid having an X portion to a diamino compound having a Y portion is X/Y<1, so that the diamino compound having a Y portion is located at the terminals of the polymer. Preferably, the ratio is in the range: 0.6<X/Y<0.98.

Heat-resistant polymer (A) of the general formula (1) can be synthesized using a diamino compound with a Y portion having introduced therein Z. In the introduction of Z into the general formula (1), Z can be introduced through an amide linkage by reacting an active ester compound having Z with a compound having a Y portion in an organic solvent. For example, there can be mentioned methods using an acid halide compound or an acid anhydride.

In this case, the introduction rate of Z can be controlled by changing the equivalence ratio of the corresponding active ester compound. A preferred equivalence ratio of the corresponding active ester compound is in the range of 0.5 to 40% by mole, based on the mole of Y.

The functional group R can be introduced through an ether linkage or an ester linkage. Examples of introduction methods include an addition reaction utilizing deacidhalogenation with a halogen compound or acid halide compound having R as a substituent, and an addition reaction with vinyl ether.

In the present invention, the polybenzoxazole precursor which is a specific example of heat-resistant polymer (A) of the general formula (1) can be obtained as shown in, for example, Polymer Letter., vol. 2, pp. 655–659 (1964), by reacting a dicarboxylic acid dihalide, such as dicarboxylic acid chloride or dicarboxylic acid bromide, with a dihydroxydiamine. In this case, it is preferred that the reaction is conducted in an organic solvent in the presence of a dehalogenacid catalyst. Dicarboxylic acid dichloride can be obtained by reacting a dicarboxylic acid with thionyl chloride.

The photoreactive compound (B) used in the present invention is a photosensitive agent which undergoes a reaction with light to generate an acid and has a function such that the acid formed increases the solubility of the portion of the resin composition exposed to a light in an alkaline aqueous solution. Examples of the photosensitive agent include o-quinonediazide compounds, aryldiazonium salts, diaryliodonium salts, and triarylsulfonium salts, and the photosensitive agent is not limited to these compounds and any compounds which form an acid by irradiation with light can be used.

The o-quinonediazide compound can be obtained by subjecting an o-quinonediazidosulfonyl chloride, a hydroxy compound, and an amino compound to condensation reaction in the presence of a dehydrochlorination agent. As the o-quinonediazidosulfonyl chloride, for example, benzoquinone-1,2-diazido-4-sulfonyl chloride, naphthoquinone-1,2-diazido-5-sulfonyl chloride, or naphthoquinone-1,2-diazido-4-sulfonyl chloride can be used, but the o-quinonediazidosulfonyl chloride is not limited to these.

As the compound to be reacted with the o-quinonediazidosulfonyl chloride, a hydroxy compound is preferred from the viewpoint of achieving excellent photosensitivity properties. The hydroxy compound that can be used includes, for example, hydroquinone, resorcinol, pyrogallol, bisphenol A, bis(4-hydroxyphenyl)methane, 2,2-bis(4-hydroxyphenyl)hexafluoropropane, 2,3,4-trihydroxybenzophenone, 2,3,4,4'-tetrahydroxybenzophenone, 2,2',4,4'-tetrahydroxybenzophenone, 2,3,4,2',3'-pentahydroxybenzophenone, 2,3,4,3',4',5'-hexahydroxybenzophenone, bis(2,3,4-trihydroxyphenyl)methane, bis(2,3,4-trihydroxyphenyl)propane, 4b,5,9b,10-tetrahydro-1,3,6,8-tetrahydroxy-5,10-dimethylindeno-[2,1-a]indene, tris(4-hydroxyphenyl)methane, and tris(4-hydroxyphenyl)ethane. However, the hydroxy compound is not limited to these.

The aryldiazonium salt, diaryliodonium salt, and triarylsulfonium salt that can be used include, for example, benzenediazonium p-toluenesulfonate, diphenyliodonium 9,10-dimethoxyanthracene-2-sulfonate, tris(4-tert-butylphenyl)sulfonium trifluoromethanesulfonate, N-naphthalimide trifluoromethanesulfonate, p-nitrobenzyl-9,10-dimethoxyanthracene-2-sulfonate, 4-methoxy-α-[[[(4-methylphenyl)sulfonyl]oxy]imino]benzeneacetonitrile, and 2-(2'-furylethenyl)-4,6-bis(trichloromethyl)-1,3,5-triazine. However, the salts are not limited to these.

These photosensitive agents may be used individually or as combination of two or more of them. The amount of the photosensitive agent used is generally 0.1 to 40 parts by weight when one type of photosensitive agent is used per 100 parts by weight of the heat-resistant polymer component (A), and, when two or more photosensitive agents are used in combination, the total amount is 0.1 to 40 parts by weight per 100 parts by weight of the heat-resistant polymer component (A). In either case, the amount of photosensitive agent(s) formulated is more preferably in the range of 1 to 20 parts by weight.

In the present invention, the solvent (C) preferably includes, for example, polar solvents, such as gamma-butyrolactone, N-methyl-2-pyrrolidone, N-acetyl-2-pyrrolidone, N,N-dimethylacetamide, N,N-dimethyl sulfoxide, hexamethylphosphoryltriamide, dimethylimidazolidinone, and N-acetyl-ε-caprolactam. In addition to these polar solvents, ketones, esters, lactones, ethers, halogenated hydrocarbons, and hydrocarbons, for example, acetone, diethyl ketone, methyl ethyl ketone, methyl isobutyl ketone, cyclohexanone, methyl acetate, ethyl acetate, butyl acetate, diethyl oxalate, diethyl malonate, diethyl ether, ethylene glycol dimethyl ether, diethylene glycol dimethyl ether, tetrahydrofuran, dichloromethane, 1,2-dichloroethane, 1,4-dichlorobutane, trichloroethane, chlorobenzene, o-dichlorobenzene, hexane, heptane, octane, benzene, toluene, and xylene can also be used. These organic solvents may be used individually or as combinations of two or more of them. There is no particular limitation on the type of the organic solvent as long as the organic solvent dissolves the photosensitive resin composition of the present invention.

The photosensitive resin composition of the present invention may include, in addition to the above-described essential components, a silane coupling agent or a base polymer modified with diaminosiloxane at the Y portion in the general formula (1) described above, as an agent for improving the adhesion to a silicon substrate.

The silane coupling agent preferably includes alkoxysilanes from the viewpoint of achieving high reactivity to a silicone substrate Examples of the alkoxysilane include vinyltrimethoxysilane, N-(2-aminoethyl)-3-aminopropylmethyltrimethoxysilane, 3-aminopropyltrimethoxysilane, N-methylaminopropyltrimethoxysilane, 3-glycidoxypropyltrimethoxysilane, 2-(3,4-epoxycyclohexyl)ethyltrimethoxysilane, 3-methacryloxypropyltrimethoxysilane, 3-mercaptopropyltrimethoxysilane, N-(1,3-dimethylbutylidene)-3-(triethoxysilyl)-1-propanamine, N,N-bis[3-(trimethoxysilyl)propyl]ethylenediamine, N-(3-trimethoxysilylpropyl)pyrrole, ureidopropyltrimethoxysilane, (3-triethoxysilylpropyl)-tert-butylcarbamate, N-phenylaminopropyltrimethoxysilane, 3-isocyanatopropyltriethoxysilane, and (furfuryloxymethyl)triethoxysilane.

For improving the photosensitive resin film contrast, a dissolution promoter can be used. Examples of such dissolution promoters include compounds having an acid functional group. As the acid functional group, preferred are a phenolic hydroxyl group, a carboxylic acid group, and a sulfonic acid group. Examples of dissolution promoters include methylenebisphenol, 2,2'-methylenebis(4-methylphenol), 4,4'-oxybisphenol, 4,4'-(1-methylethylidene)bis(2-methylphenol), 4,4'-(1-phenylethylidene)bisphenol, 5,5'-(1-methylethylidene)bis[1,1'-(biphenyl)-2-ol], 4,4,4-ethylidynetrisphenol, 2,6-bis[(2-hydroxy-5-methylphenyl)methyl]-4-methylphenol, 4,4'-[1-[4-{1-(4-hydroxyphenyl)-1-methylethyl}phenyl] ethylidene]-bisphenol, 4,4'-sulfonyldiphenol, (2-hydroxy-5-methyl)-1,3-benzenedimethylol, 3,3'-methylenebis(2-hydroxy-5-methylbenzenemethanol), salicylic acid, malonic acid, glutaric acid, 2,2-dimethylglutaric acid, maleic acid, diglycolic acid, 1,1-cyclobutanedicarboxylic acid, 3,3-tetramethyleneglutaric acid, 1,3-cyclohexanedicarboxylic acid, 1,4-cyclohexanedicarboxylic acid, 1,3-adamantanedicarboxylic acid, 1,2-phenylenedioxydiacetic acid, 1,3-phenylenediacetic acid, 1,4-phenylenediacetic acid, terephthalic acid, isophthalic acid, 4,4'-oxydiphenyldicarboxylic acid, 4,4-biphenyldicarboxylic acid, and 4-hydroxybenzenesulfonic acid. These dissolution promoters may be used individually or as combinations of two or more of them. Also, depending on purposes, a dissolution inhibitor and a stabilizer may be formulated.

The photosensitive resin composition of the present invention is applied to a base material, such as a silicon wafer, a metallic substrate, or a ceramic substrate, by a dipping method, a spraying method, a screen printing method, or a spin coating method, and dried by appropriately heating the solvent to obtain a film having no tackiness. The film is subjected to exposure treatment by irradiation with active rays or chemical rays through a mask having a desired pattern. As the active rays or chemical rays to be irradiated, light from a contact/proximity exposure machine with an ultra-high pressure mercury lamp, a mirror projection exposure machine, an i-line stepper, a g-line stepper, other ultraviolet light and visible light sources, and X rays and electron beams can be used. Thereafter, if desired, a post exposure bake (PEB) treatment is conducted, followed by development. The exposed portion is removed by dissolution using a developer to obtain a desired positive pattern.

As the developer, an alkaline aqueous solution is used. For example, an aqueous solution of an alkali metal hydroxide, such as caustic potash or caustic soda, or an aqueous solution of a quaternary ammonium hydroxide, such as tetramethylammonium hydroxide, tetraethylammonium hydroxide, or choline, or an aqueous solution of amine, such as ethanolamine, propylamine, or ethylenediamine, is used. After the development, if desired, rinsing is conducted using water or a poor solvent. As the rinsing liquid, for example, methanol, ethanol, isopropyl alcohol, benzene, toluene, xylene, methyl cellosolve, or water is used.

The thus obtained pattern is heated to remove the photosensitive agent and solvent to obtain a stable, highly heat-resistant polyimide pattern.

On this occasion, the heating temperature is preferably 150 to 500° C., more preferably 200 to 400° C. When the heating temperature is lower than 150° C., the mechanical and thermal properties of the resultant film tend to be deteriorated. On the other hand, when the heating temperature is higher than 500° C., the mechanical and thermal properties of the resultant film tend to be similarly deteriorated.

Further, on this occasion, the heating time is preferably 0.05 to 10 hours. When the heating time is shorter than 0.05 hour, the mechanical and thermal properties of the resultant film tend to be deteriorated, and, when the heating time is longer than 10 hours, the mechanical and thermal properties of the resultant film tend to be similarly deteriorated.

The photosensitive resin composition of the present invention can be used in electronic components, such as a semiconductor device and a multilayer wiring board, and specifically, it can be used in the formation of a surface protecting film layer or an interlayer dielectric film layer for semiconductor devices or an interlayer dielectric film layer in a multilayer wiring boards. The semiconductor device which is one example of the electronic component of the present invention is not particular limited as long as it has a surface protecting film layer or an interlayer dielectric film layer formed from the above composition, and the semiconductor device can have various configurations as described above.

Hereinafter, one example of a fabrication process for fabricating a semiconductor device which is one example of the electronic component of the present invention will be described with reference to the attached drawing.

FIGS. 1(A) to 1(E) are cross-sectional views illustrating the process of fabricating a semiconductor device having a multilayer wiring configuration. In FIGS. 1(A) to 1(E), a semiconductor substrate 1 comprised of, for example, an Si substrate having a circuit element is covered with a protecting film layer 2 comprised of, for example, a silicon oxide film, except for a predetermined portion of the circuit element, and a first conductor layer 3 is formed on the exposed circuit element. An interlayer dielectric film layer 4 is formed on the semiconductor substrate 1 by, for example, a spin coating method as shown in FIG. 1(A) (step (a)).

Figure 1B:
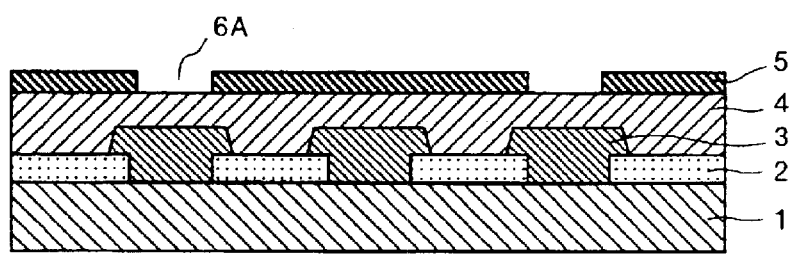

Then, a photosensitive resin layer 5 made of chlorinated rubber or phenolic novolak is formed on the interlayer dielectric film layer 4 by a spin coating method, and a window 6A is formed by a known photographic etching technique so that a predetermined portion of the interlayer dielectric film layer 4 is exposed as shown in FIG. 1(B) (step (b)).

Figure 1C:
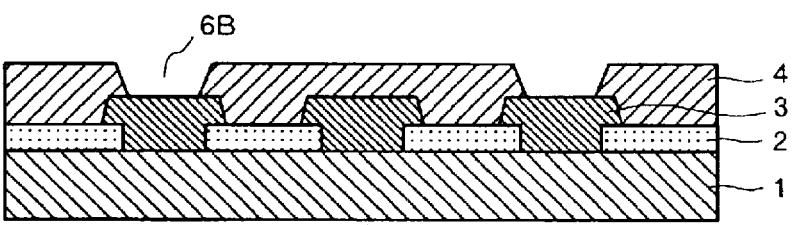

The exposed portion of interlayer dielectric film layer 4 through the window 6A is selectively etched by a dry etching means using gas of oxygen or tetrafluorocarbon to form a window 6B. Then, a photosensitive resin layer 5 is completely removed using an etching solution such that only the photosensitive resin layer 5 is etched without etching the first conductor layer 3 exposed through the window 6B as shown in FIG. 1(C) (step (c)).

Figure 1D:
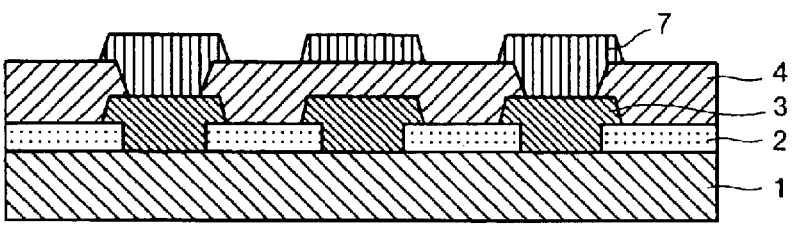

Then, a second conductor layer 7 is formed using a known photographic etching technique (photolithography) to achieve complete electrical connection with the first conductor layer 3 as shown in FIG. 1(D) (step (d)). When forming a multilayer wiring configuration comprised of three layers or more, the above steps are repeated to form individual layers.

Figure 1E:
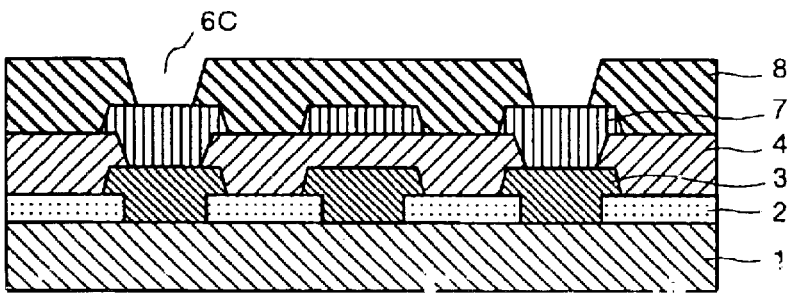

Subsequently, a surface protecting film layer 8 is formed as shown in FIG. 1(E). In the example illustrated in FIGS. 1(A) to 1(E), the surface protecting film layer 8 is a resin film formed by applying the photosensitive resin composition to the structure shown in FIG. 1(C) by use of a spin coating method, drying the composition applied, and irradiating the dried composition with light through a mask having a pattern for forming a window 6C in a predetermined portion, developing the resultant with an alkaline aqueous solution to form a pattern and then heating this to form a patterned resin film. This resin film protects the conductor layer from an external stress or α-rays, and the resultant semiconductor device has excellent reliability due to this resin film. In the above example, the interlayer dielectric film layer 4 can be formed using the photosensitive resin composition of the present invention.

EXAMPLES

Hereinafter, the present invention will be described by way of examples. However, the present invention should not be considered to be limited to the examples.

Synthesis Example 1

In a closed reaction vessel equipped with a stirrer, a thermometer, and a nitrogen feeding pipe, a solution of 100 milliliters (ml) of dry N-methylpyrrolidone and 25.8 grams (g) (0.1 mole) of 4,4'-oxybis(carboxyphenyl) was cooled to 0° C. and 23.8 g (0.2 mole) of thionyl chloride was added dropwise to the solution, and, after completion of the addition, the resultant mixture was stirred for 30 minutes to obtain reaction solution A-1.

Separately, in another closed reaction vessel equipped with a stirrer, a thermometer, and a nitrogen feeding pipe, a solution of 100 ml of dry N-methylpyrrolidone, 40.3 g (0.11 mole) of 2,2-bis(3-amino-4-hydroxyphenyl)-1,1,1,3,3,3-hexafluoropropane, and 1.58 g (0.02 mole) of pyridine was cooled to 0° C., and 2.09 g (0.02 mole) of cyclopropanecarbonyl chloride was added dropwise to the solution, and, after completion of the addition, the resultant mixture was stirred at room temperature for 30 minutes. Further, 15.82 g (0.2 mole) of pyridine was added to the mixture and cooled to 0° C. Then, the above-obtained reaction solution A-1 was added dropwise over 30 minutes, followed by stirring at room temperature for 30 minutes. The resultant reaction mixture was treated with 2.0 liters of ion-exchanged water while vigorously stirring. The solid matter deposited was further washed with deionized water, and dried by suction on a filter for filtration, and dried under reduced pressure at room temperature until the water content of the solid matter became less than 1.0% by weight to obtain a polymer P-1. The polymer had a weight average molecular weight of 25,600 and a dispersion degree of 1.90.

Synthesis Example 2

In a closed reaction vessel equipped with a stirrer, a thermometer, and a nitrogen feeding pipe, 2.24 g (0.02 mole) of 1,2-cyclopropanedicarboxylic anhydride was added to a solution of 100 ml of dry N-methylpyrrolidone and 40.3 g (0.11 mole) of 2,2-bis(3-amino-4-hydroxyphenyl)-1,1,1,3,3,3-hexafluoropropane. The resultant was stirred at 40° C. for 2 hours and then at room temperature overnight. To the resultant mixture was added 15.82 g (0.2 mole) of pyridine, and the mixture was cooled to 0° C. Then, the reaction solution A-1 obtained in Synthesis Example 1 was added dropwise over 30 minutes, followed by stirring at room temperature for 30 minutes. The resultant reaction mixture was treated with 2.0 liters of deionized water while vigorously stirring. The solid matter deposited was further washed with deionized water, and dried by suction on a filter for filtration, followed by drying under reduced pressure at room temperature until the water content of the solid matter became less than 1.0% by weight to obtain a polymer P-2. The polymer had a weight average molecular weight of 24,500 and a dispersion degree of 1.82.

Synthesis Example 3

In a closed reaction vessel equipped with a stirrer, a thermometer, and a nitrogen feeding pipe, 2.37 g (0.02 mole) of cyclobutanecarbonyl chloride was added to a solution of 100 ml of dry N-methylpyrrolidone and 40.3 g (0.11 mole) of 2,2-bis(3-amino-4-hydroxyphenyl)-1,1,1,3,3,3-hexafluoropropane and the mixture was stirred at 40° C. for 2 hours and then at room temperature overnight. To the resultant mixture was added 15.82 g (0.2 mole) of pyridine, and the mixture was cooled to 0° C. Then, the reaction solution A-1 obtained in Synthesis Example 1 was added dropwise over 30 minutes, followed by stirring the mixture at room temperature for 30 minutes. The resultant reaction mixture was treated with 2.0 liters of deionized water while vigorously stirring. The solid matter deposited was further washed with deionized water, and dried by suction on a filter for filtration, and dried under reduced pressure at room temperature until the water content of the solid matter became less than 1.0% by weight to obtain a polymer P-3. The polymer had a weight average molecular weight of 23,300 and a dispersion degree of 1.64.

Synthesis Example 4

In a closed reaction vessel equipped with a stirrer, a thermometer, and a nitrogen feeding pipe, a solution of 100 ml of dry N-methylpyrrolidone, 40.3 g (0.11 mole) of 2,2-bis(3-amino-4-hydroxyphenyl)-1,1,1,3,3,3-hexafluoropropane and 1.58 g (0.02 mole) of pyridine was cooled to 0° C., and 1.81 g (0.02 mole) of acryloyl chloride was added thereto dropwise, followed by stirring the mixture at room temperature for 30 minutes. Further, to the resultant mixture was added 15.82 g (0.2 mole) of pyridine, and the mixture was cooled to 0° C. Then, the reaction solution A-1 obtained in Synthesis Example 1 was added dropwise over 30 minutes, followed by stirring the mixture at room temperature for 30 minutes. The resultant reaction mixture was treated with 2.0 liters of deionized water while vigorously stirring. The solid matter deposited was further washed with deionized water, and dried by suction on a filter for filtration, and dried under reduced pressure at room temperature until the water content of the solid matter became less than 1.0% by weight to obtain a polymer P-4. The polymer had a weight average molecular weight of 22,700 and a dispersion degree of 1.62.

Synthesis Example 5

In a closed reaction vessel equipped with a stirrer, a thermometer, and a nitrogen feeding pipe, 1.96 g (0.02 mole) of maleic anhydride was added to a solution of 100 ml of dry N-methylpyrrolidone and 40.3 g (0.11 mole) of 2,2-bis(3-amino-4-hydroxyphenyl)-1,1,1,3,3,3-hexafluoropropane and then stirred at 40° C. for 2 hours and then at room temperature overnight. To the resultant mixture was added 15.82 g (0.2 mole) of pyridine, and the mixture was cooled to 0° C. The reaction solution A-1 obtained in Synthesis Example 1 was added dropwise over 30 minutes, followed by stirring the mixture at room temperature for 30 minutes. The resultant reaction mixture was treated with 2.0 liters of deionized water while vigorously stirring. The solid matter deposited was further washed with deionized water, and dried by suction on a filter for filtration, and dried under reduced pressure at room temperature until the water content of the solid matter became less than 1.0% by weight to obtain a polymer P-5. The polymer had a weight average molecular weight of 25,100 and a dispersion degree of 1.68.

Synthesis Example 6

In a closed reaction vessel equipped with a stirrer, a thermometer, and a nitrogen feeding pipe, while cooling, 30.4 g (0.3 mole) of triethylamine was added dropwise to a solution of 30.6 g (0.1 mole) of tris(4-hydroxyphenyl) ethane, 74.4 g (0.29 mole) of naphthoquinone-1,2-diazido-4-sulfonyl chloride, and 150 g of dioxane to effect a reaction. The resultant reaction mixture was filtered, and the filtrate was treated with 2.0 liters of deionized water while vigorously stirring. The solid matter deposited was further washed with deionized water, and dried by suction on a filter for filtration, and dried under reduced pressure at room temperature until the water content of the solid matter became less than 1.0% by weight to obtain orthoquinonediazide compound B-1. The polymer had a weight average molecular weight of and a dispersion degree of.

Example 1

In a three-necked flask equipped with a stirrer, a thermometer, and a nitrogen feeding pipe, 100 g of the P-1 obtained in Synthesis Example 1 was mixed with and dissolved in 140 g of γ-butyrolactone by stirring, and then 10.0 g of the compound B-1 obtained in Synthesis Example 6 was added thereto and dissolved by stirring at room temperature overnight, followed by filtration using a filter, to obtain a photosensitive resin composition solution. The solution was spin-coated on a 5-inch silicon wafer and then dried to form a film of 5.0±1.0 micrometers ($\mu$m), and then, the film was subjected to exposure through a pattern mask using an i-line stepper at an exposure dose of 200 to 1,000 millijoules per square centimeters (mJ/cm$^2$). The resultant film was allowed to stand in a dark box for 1 hour, and then subjected to paddle development using a 2.38% aqueous solution of tetramethylammonium hydroxide, and rinsed with pure water. As a result, an excellent relief pattern having no development residue on the pattern bottom portion was obtained under conditions such that the remaining film thickness rate after the development was 85% and the exposure dose was 480 mJ/cm$^2$. Separately, the photosensitive resin composition solution was spin-coated on a 5-inch silicon wafer and then dried to form a film of 18.0±1.0 $\mu$m, and then, the film was subjected to exposure through a pattern mask using a contact aligner at an exposure dose of 1,000 mJ/cm$^2$. The resultant film was allowed to stand in a dark box for 1 hour, and then subjected to paddle development using a 2.38% aqueous solution of tetramethylammonium hydroxide to obtain a pattern in a strip form of 10 millimeters (mm)×120 mm. The resultant wafer was baked for curing in an oven replaced by nitrogen gas at 320° C. for 1 hour to obtain a cured film of 10.0±1.0 $\mu$m. The thin film in a strip form was peeled off from the silicon wafer using an aqueous solution of hydrofluoric acid and dried and then, a tensile strength was measured using an autograph. As a result, the tensile strength was 135 megapascals (Mpa). Further, the photosensitive resin composition solution was allowed to stand at room temperature for 1 month, and a viscosity of the solution after being allowed to stand was measured by means of an E type rotary viscometer. As a result, the change rate of the viscosity With time from the initial viscosity increased merely by 1.2%.

Example 2

Substantially the same procedure as that in Example 1 was repeated using substantially the same formulation except that 100 g of the P-2 was used instead of the P-1. As a result, an excellent relief pattern having no development residue on the pattern bottom portion was obtained under conditions such that the remaining film thickness rate after the development was 83% and the exposure dose was 500 mJ/cm$^2$. On the other hand, the cured film had a tensile strength of 142 MPa. Further, a change of the viscosity with time was measured in the same manner as in Example 1 and, as a result, the change rate increased merely by 2%.

Example 3

Substantially the same procedure as that in Example 1 was repeated using substantially the same formulation except that 100 g of the P-3 was used instead of the P-1. As a result, an excellent relief pattern having no development residue on the pattern bottom portion was obtained under conditions such that the remaining film thickness rate after the development was 87% and the exposure dose was 520 mJ/cm$^2$. On the other hand, the cured film had a tensile strength of 136 MPa. Further, a change of the viscosity with time was measured in the same manner as in Example 1 and, as a result, the change rate increased merely by 0.5%.

Comparative Example 1

Substantially the same procedure as that in Example 1 was repeated using substantially the same formulation except that 100 g of the P-4 was used instead of the P-1. As a result, an excellent relief pattern having no development residue on the pattern bottom portion was obtained under conditions such that the remaining film thickness rate after the development was 87% and the exposure dose was 540 mJ/cm$^2$. On the other hand, the cured film had a tensile strength of 133 MPa. Further, a change of the viscosity with time was measured in the same manner as in Example 1 and, as a result, the change rate increased greatly by 85%. Thus, formation of the desired film thickness applied was impossible.

Comparative Example 2

Substantially the same procedure as that in Example 1 was repeated using substantially the same formulation except that 100 g of P-5 was used instead of P-1. As a result, an excellent relief pattern having no development residue on the pattern bottom portion was obtained under conditions such that the remaining film thickness rate after the development was 86% and the exposure dose was 500 mJ/cm$^2$. On the other hand, the cured film had a tensile strength of 127 MPa. Further, the measurement of a change of the viscosity with time was attempted in the same manner as in Example 1, but the solution was gelled, thus making it impossible to measure the viscosity.

The photosensitive resin composition of the present invention includes (A) a polymer represented by the general formula (1), (B) a photoreactive compound, and (C) a solvent. The photosensitive resin composition having such a construction forms a cured resin having excellent properties and exhibits excellent storage stability. Therefore, according to the present invention, there can be provided a heat-resistant resin composition which forms a cured resin having excellent properties and which has excellent storage stability, a process for forming a relief pattern using the resin composition, and an electronic component having an electronic device with the pattern.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A photosensitive resin composition comprising:
    (A) a heat-resistant polymer represented by general formula (1)

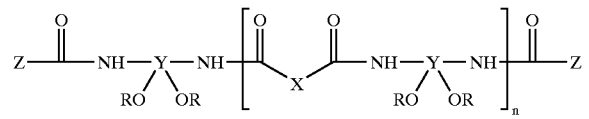

(1)

where X represents a divalent organic group; Y represents a tetravalent organic group; Z represents a cyclic compound group free of reactive unsaturated bonds; R represents hydrogen or a monovalent organic group; and n is an integer of 2 to 500 and represents the number of repeating units of the polymer;
    (B) a photoreactive compound which generates an acid upon undergoing a reaction with light; and
    (C) a solvent,
    wherein said photosensitive resin composition is a positive photosensitive resin composition.

2. The photosensitive resin composition according to claim 1, wherein at least one of the organic groups X and Y is an aromatic group.

3. The photosensitive resin composition according to claim 1, wherein the cyclic compound group Z is a compound group having an alicyclic structure.

4. The photosensitive resin composition according to claim 2, wherein the cyclic compound group Z is a compound group having an alicyclic structure.

5. The photosensitive resin composition according to claim 3, wherein the compound group having an alicyclic structure has 3 or 4 carbon atoms.

6. The photosensitive resin composition according to claim 4, wherein the compound group having an alicyclic structure has 3 or 4 carbon atoms.

7. The photosensitive resin composition according to claim 1, wherein the divalent organic group represented by X comprises at least one divalent group derived from 3-fluoroisophthalic acid, 2-fluoroisophthalic acid, 3-fluorophthalic acid, 2-fluorophthalic acid, 2,4,5,6-tetrafluoroisophthalic acid, 3,4,5,6-tetrafluorophthalic acid, 4,4'-hexafluoroisopropylidenediphenyldicarboxylic acid, perfluorosuberic acid, 2,2'-bis(trifluoromethyl)-4,4'-biphenylenedicarboxylic acid, terephthalic acid, isophthalic acid, 4,4'-oxydiphenyldicarboxylic acid, 5-nitroisophthalic acid, 1,4-naphthalenedicarboxylic acid, 2,6-naphthalenedicarboxylic acid, and 4,4'-biphenyldicarboxylic acid.

8. The photosensitive resin composition according to claim 1, wherein the tetravalent organic group represented by Y comprises at least one divalent group derived from 4,4'-diamino-3,3'-dihydroxybiphenyl, 2,2'-bis(3-amino-4-hydroxyphenyl)propane, and 2,2'-bis(3-amino-4-hydroxyphenyl)hexafluoropropane.

9. The photosensitive resin composition according to claim 1, wherein Z comprises at least one group selected from the group consisting of cyclopropyl, cyclobutyl, 2-phenyl-1-cyclopropyl, 1-phenyl-1-cyclopropyl, 1-benzocyclobutenyl, 2-methylcyclopropenyl, 1-hydroxy-1-cyclopropyl, 1-carboxy-1-cyclopropyl, and 1-carboxy-1-cyclobutyl.

10. The photosensitive resin composition according to claim 1, wherein the heat-resistant polymer has a weight average molecular weight in the range of 5,000 to 80,000.

11. A process for forming a relief pattern, comprising:
    applying the photosensitive resin composition according to claim 1 to a support substrate and drying the composition applied to form a photosensitive resin film;
    subjecting the dried photosensitive resin film to exposure;
    subjecting the exposed photosensitive resin film to development using an alkaline aqueous solution; and
    subjecting the developed photosensitive resin film to heating treatment.

12. An electronic component having an electronic device including at least an interlayer dielectric film layer and a surface protecting film layer,
    wherein at least one of the interlayer dielectric film layer and the surface protecting film layer comprises a resin film formed from the photosensitive resin composition according to claim 1.

13. An electronic component having an electronic device including at least an interlayer dielectric film an a surface protecting layer,
wherein at least one of the interlayer dielectric film and the surface protecting layer comprises a resin film, and wherein the resin film comprises a patterned film formed by the process according to claim 11.

14. The photosensitive resin composition according to claim 1, wherein the photoreactive compound generates the acid such that the acid formed increases the solubility in an alkaline aqueous solution of the portion of the resin composition exposed to the light.

15. The photosensitive resin composition according to claim 1, wherein said photoreactive compound is selected from the group consisting of o-quinonediazide compounds, aryldiazonium salts, diaryliodonium salts and triarylsulfonium salts.

16. The photosensitive resin composition according to claim 1, containing 0.1 to 40 parts by weight of the photoreactive compound per 100 parts by weight of the heat-resistant polymer.

* * * * *